(12) United States Patent
Maruyama et al.

(10) Patent No.: US 6,407,946 B2
(45) Date of Patent: Jun. 18, 2002

(54) NONVOLATILE SEMICONDUCTOR MEMORY DEVICE

(75) Inventors: Takafumi Maruyama; Makoto Kojima, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/731,005

(22) Filed: Dec. 7, 2000

(30) Foreign Application Priority Data

Dec. 8, 1999  (JP) .......................................... 11-348459

(51) Int. Cl.[7] .............................................. G11C 16/06
(52) U.S. Cl. .............................. 365/185.2; 365/185.21; 365/207; 365/210
(58) Field of Search ..................... 365/185.21, 185.2, 365/210, 189.09, 207, 208, 185.23

(56) References Cited

U.S. PATENT DOCUMENTS

| | | | |
|---|---|---|---|
| 5,218,570 A | | 6/1993 | Pascucci et al. ....... 365/189.01 |
| 5,528,543 A | * | 6/1996 | Stiegler ....................... 365/207 |
| 5,559,737 A | * | 9/1996 | Tanaka et al. ......... 365/185.25 |
| 5,608,676 A | * | 3/1997 | Medlock et al. ........ 365/189.09 |
| 5,642,308 A | * | 6/1997 | Yoshida .................. 365/185.12 |
| 5,986,940 A | * | 11/1999 | Atsumi et al. ........... 365/185.3 |

FOREIGN PATENT DOCUMENTS

| | | |
|---|---|---|
| JP | 7-201194 | 8/1995 |
| JP | 9-320283 | 12/1997 |

* cited by examiner

Primary Examiner—David Nelms
Assistant Examiner—Gene N. Auduong
(74) Attorney, Agent, or Firm—McDermott, Will & Emery (57) ABSTRACT

To read data stored on a memory cell transistor with a floating gate, a flash memory uses: a single-gate reference transistor; a differential sense amplifier; and a gate voltage generator for generating a gate voltage for the reference transistor. The gate voltage generator includes: a dummy cell transistor, which has the same structure as the memory cell transistor and has been turned ON; a current mirror for creating a current proportional to a drain current of the dummy cell transistor; an NMOS transistor for generating a gate voltage for the reference transistor in accordance with the current created by the current mirror; and a voltage hold circuit for holding the gate voltage generated. Even if temperature or fabricating process conditions have changed, this construction ensures accurate and high-speed read operation.

5 Claims, 6 Drawing Sheets

NONVOLATILE SEMICONDUCTOR MEMORY DEVICE

BACKGROUND OF THE INVENTION

The present invention generally relates to a nonvolatile semiconductor memory device, and more particularly relates to an electrically erasable and programmable read only memory (EEPROM).

A flash EEPROM (flash memory), which can erase data at a time on a block-by-block basis, is known in the art. An n-channel memory cell transistor, including control gate (CG), floating gate (FG), drain and source, for example, is used for the flash memory. In a program cycle, electrons are stored on the floating gate by a hot electron injection mechanism, and the memory cell transistor (which will be herein called MCT) has a relatively high threshold voltage. The MCT that has stored data "1" thereon in this manner is herein defined as being in "OFF state". In an erase cycle, electrons are removed from the floating gate, and the MCT has a relatively low threshold voltage. The MCT that has stored data "0" thereon in this way is herein defined as being in "ON state". In a read cycle, a predetermined gate voltage is applied between the control gate and source while the drain and source are supplied with positive low potential and ground potential, respectively.

A differential sensing flash memory that can perform a high-speed read operation is also known. This flash memory includes a dummy cell transistor (which will be herein called DCT) and a differential sense amplifier to read data from an MCT thereof. The DCT has the same construction as the MCT and is turned ON beforehand. The drains of the MCT and DCT are connected to the differential sense amplifier via a bit line and a reference line, respectively. In a read cycle, the drain current of the DCT is adjusted to half of the drain current of the MCT in the ON state. The differential sense amplifier compares a bit line voltage with a reference voltage, thereby sensing the state of the MCT. The bit line and reference voltages are variable with the drain currents of the MCT and DCT, respectively.

This construction, however, causes a phenomenon called "RDD (read drain disturb)". Specifically, as the read cycle operations are repeatedly performed, some hot electrons are adversely injected into the floating gate of the DCT. As a result, the threshold voltage of the DCT rises and its drain current decreases.

To solve this problem, the DCT is replaced by a single-gate NMOS transistor, in which no hot electrons can be injected into the floating gate, according to the technique disclosed in Japanese Laid-Open Publication 9-320283. The gate voltage applied to the gate of the NMOS transistor (i.e., reference transistor) is obtained by dividing a voltage with magnitude approximately equal to that of the gate voltage applied to the control gate of the MCT using capacitive divider.

The drain current of an MCT, including control gate and floating gate, and the drain current of a single-gate NMOS transistor show mutually different temperature dependence. Also, even if fabricating process conditions have changed in the same way the drain current characteristics of these transistors change differently in response to the variation. Therefore, according to the technique disclosed in the above-identified publication, it is impossible to change the reference voltage of the NMOS transistor as a reference transistor in accordance with the actual temperature dependence of the MCT and the variation in drain current characteristic of the MCT resulting from the variation of process conditions.

SUMMARY OF THE INVENTION

It is therefore an object of the present invention to provide a nonvolatile semiconductor memory device that ensures accurate and high-speed read operation even if temperature or fabricating process conditions have changed.

To achieve this object, the present invention provides a nonvolatile semiconductor memory device that is so constructed as to read data stored on a memory cell transistor with a floating gate by a differential sensing method. The device of the invention is characterized by generating a gate voltage for a reference transistor in accordance with the drain current characteristic of a dummy cell transistor. For this purpose, the inventive device is provided with a gate voltage generator including: a dummy cell transistor that has the same construction as the memory cell transistor; a current mirror for creating a current proportional to a drain current of the dummy cell transistor; and transistor means for generating a gate voltage for the reference transistor in accordance with the current created by the current mirror.

DETAILED DESCRIPTION OF INVENTION

Hereinafter, application of the present invention to flash memories will be described. It is noted that the present invention is also applicable to nonvolatile semiconductor memory devices other than flash memories.

Figure 1:
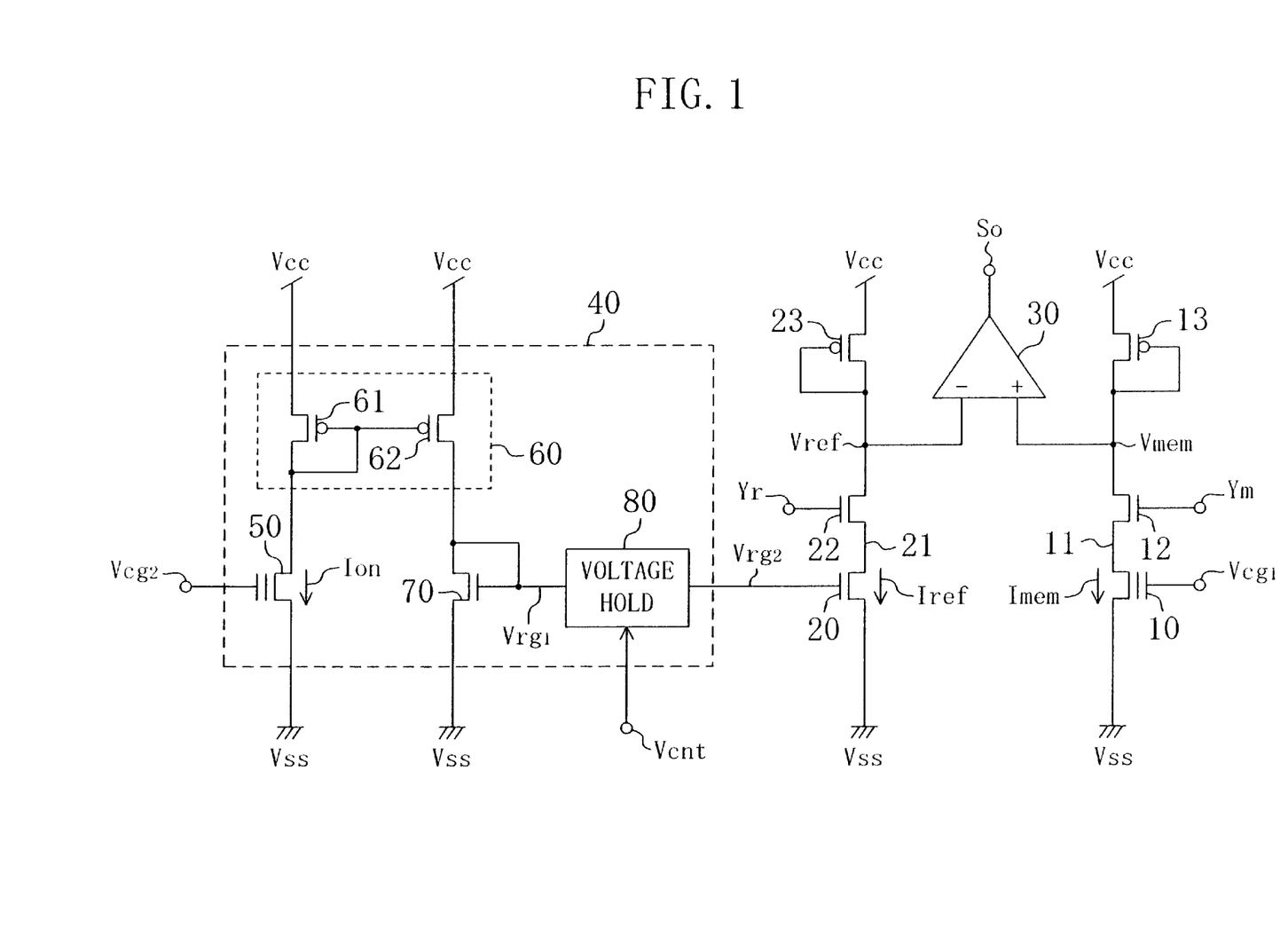
FIG. 1 is a circuit diagram illustrating an exemplary configuration for a nonvolatile semiconductor memory device according to the present invention.

FIG. 1 illustrates an exemplary configuration for a flash memory according to the present invention, more specifically, a read circuit for a memory cell transistor (MCT) 10 in a memory array. Circuits for programming and erasing are not shown in the drawings.

Figure 2:
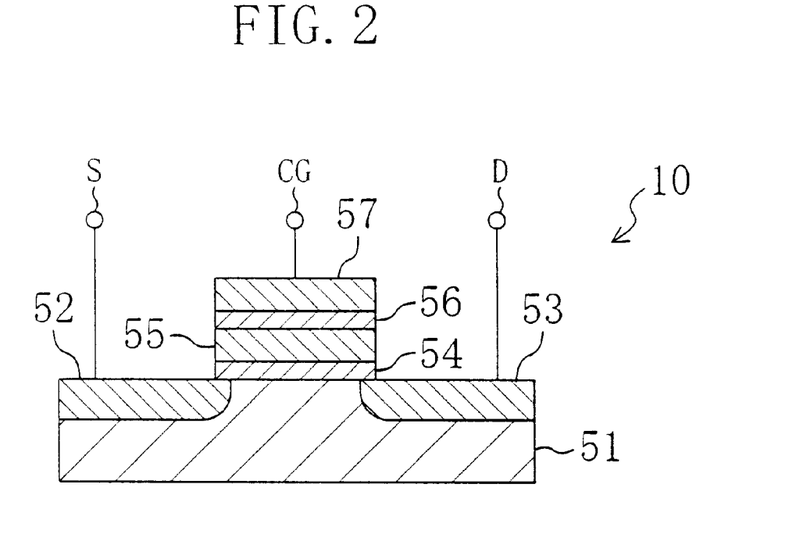
FIG. 2 is a cross-sectional view illustrating an exemplary structure for the memory cell transistor (MCT) shown in FIG. 1.
Figure 3:
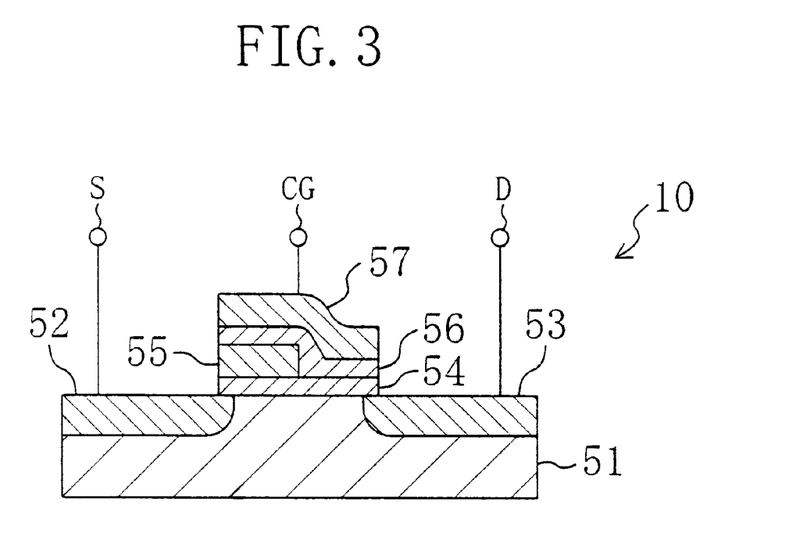
FIG. 3 is a cross-sectional view illustrating another exemplary structure for the MCT shown in FIG. 1.

FIG. 2 illustrates an exemplary structure for the MCT 10 shown in FIG. 1. The MCT shown in FIG. 2 is an n-channel transistor with a stacked structure. Specifically, the MCT 10 includes: p-type substrate 51; n-type doped regions 52 and 53; tunnel insulating film 54; polysilicon films 55 and 57; and interlevel dielectric film 56. The n-type doped regions 52 and 53 serve as source (S) and drain (D), respectively. And the polysilicon films 55 and 57 function as floating gate (FG) and control gate (CG), respectively. The MCT 10 shown in FIG. 1 may have a split structure as shown in FIG. 3.

As shown in FIG. 1, the drain and source of the MCT 10 are connected to a bit line 11 and ground Vss, respectively. Vcg1 denotes a gate voltage (word line voltage) applied to the control gate of the MCT 10 in a read cycle. The bit line 11 is connected to the non-inverting input terminal of a differential sense amplifier 30 via a column switch 12. Ym denotes a control signal for turning the column switch 12 ON where the MCT 10 has been selected. The non-inverting input terminal of the differential sense amplifier 30 is connected to a power supply Vcc through a first load transistor 13. Imem denotes a memory cell current determined by data stored on the MCT 10, while Vmem denotes a bit line voltage determined by the memory cell current Imem.

In FIG. 1, a single-gate NMOS transistor is used as a reference transistor 20. The drain and source of the reference transistor 20 are connected to a reference line 21 and ground Vss, respectively. vrg2 denotes a gate voltage applied to the gate of the reference transistor 20. The reference line 21 is connected to the inverting input terminal of the differential sense amplifier 30 via a reference switch 22. Yr denotes a signal for controlling the ON/OFF states of the reference switch 22. The inverting input terminal of the differential sense amplifier 30 is connected to the power supply Vcc via a second load transistor 23. Iref denotes a reference current flowing through the drain of the reference transistor 20 upon the application of the gate voltage vrg2. And Vref denotes a reference voltage determined by the reference current Iref. The differential sense amplifier 30 compares the bit line voltage. Vmem with the reference voltage Vref to sense the state of the MCT 10 and then supplies a signal So representing the sensing result.

The gate voltage vrg2 of the reference transistor 20 is generated by a gate voltage generator 40 based on a voltage vcg2 with magnitude approximately equal to the gate voltage Vcg1 applied to the control gate of the MCT 10. The gate voltage generator 40 shown in FIG. 1 includes: dummy cell transistor (DCT) 50; current mirror 60; single-gate NMOS transistor 70; and voltage hold circuit 80. The DCT 50, which has the same structure as the MCT 10, is so constructed as to turn ON by having electrons removed from its floating gate upon exposure to a UV ray, for example. The DCT 50 receives the voltage Vcg2 at the control gate. The drain and source of the DCT 50 are connected to an input branch of the current mirror 60 and ground Vss, respectively. The current mirror 60 is made up of two PMOS transistors 61 and 62 so as to create a current proportional to a drain current Ion of the DCT 50. The single-gate NMOS transistor 70 includes: gate and drain, each of which is shortcircuited to an output branch of the current mirror 60 so as to generate a voltage Vrg1 based on the current created by the current mirror 60; and source connected to the ground Vss. The voltage hold circuit 80 holds the voltage Vrg1 generated by the NMOS transistor 70 in response to a voltage signal Vcnt and supplies the gate voltage vrg2 to the reference transistor 20.

If the load transistors 13 and 23 are of an equal size, the reference current Iref is adjusted to a value substantially equal to (Ion+Ioff)/2. Ion and Ioff denote a memory cell current Imem where the MCT 10 is in the ON state and a memory cell current Imem where the MCT 10 is in the OFF state, respectively. This adjustment is realized by controlling the mirror ratio of the current mirror 60, for example. As a result, the reference voltage Vref is regulated to a value substantially equal to (Von+Voff)/2. Von and Voff denote a bit line voltage Vmem where the MCT 10 is in the ON state and a bit line voltage Vmem where the MCT 10 is in the OFF state, respectively. Optionally, the reference voltage Vref may be adjusted to (Von+Voff)/2 by making the size of the second load transistor 23 smaller than that of the first load transistor 13.

Figure 4:
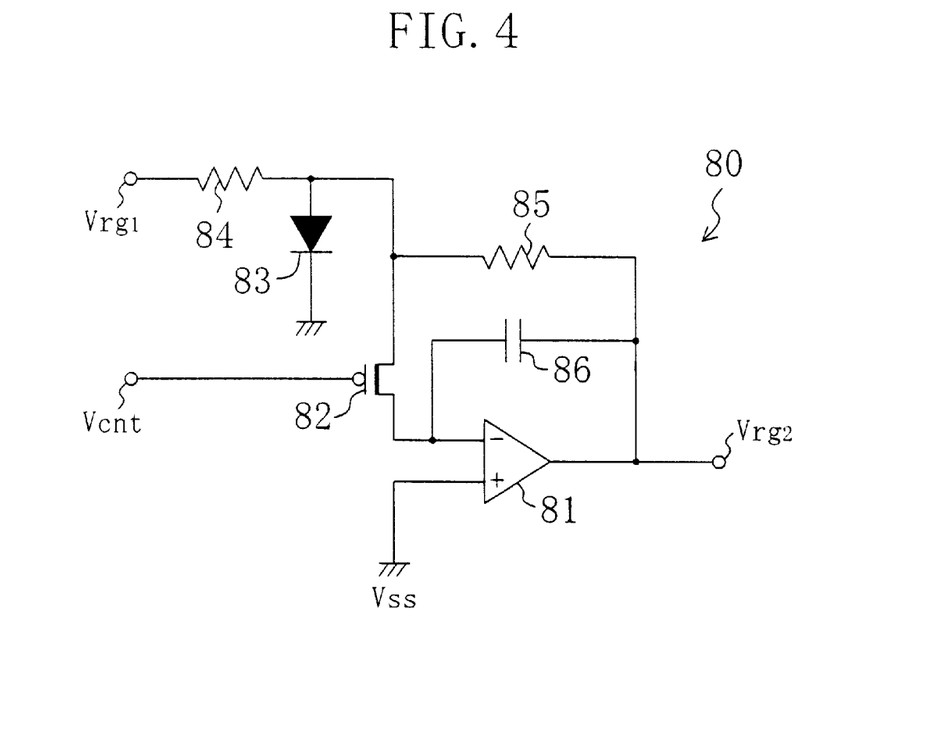
FIG. 4 is a circuit diagram illustrating an exemplary internal configuration for the voltage hold circuit shown in FIG. 1.

FIG. 4 illustrates an exemplary internal configuration for the voltage hold circuit 80 shown in FIG. 1. The voltage hold circuit 80 of FIG. 4 is made up of: operational amplifier 81; depletion-mode PMOS transistor 82; clamping diode 83; resistors 84 and 85; and capacitor 86. In this configuration, the voltage hold circuit 80 can hold a given voltage Vrg1 in the capacitor 86 in response to a voltage signal Vcnt and can supply a gate voltage Vrg2 for the reference transistor 20. Therefore, the gate voltage Vcg2 for the DCT 50 may have a pulsed waveform. Also, once the capacitor 86 has held a voltage, it is possible to cut off a current flowing through the DCT 50, current mirror 60 and NMOS transistor 70 in a subsequent read cycle. For example, in an initializing interval in which the flash memory of FIG. 1 is powered, the capacitor 86 may be made to hold a voltage. Naturally, the voltage held on the capacitor 86 may be updated every succeeding read cycle.

As described above, the flash memory of FIG. 1 is constructed to generate a gate voltage Vrg2 for the reference transistor 20 in accordance with the drain current characteristic of the DCT 50 that has the same construction as the MCT 10. Therefore, even if temperature or fabricating process conditions have changed, accurate and high-speed read operation is ensured. The voltage hold circuit 80 may be omitted and the gate of the NMOS transistor 70 may be connected directly to that of the reference transistor 20.

Figure 5:
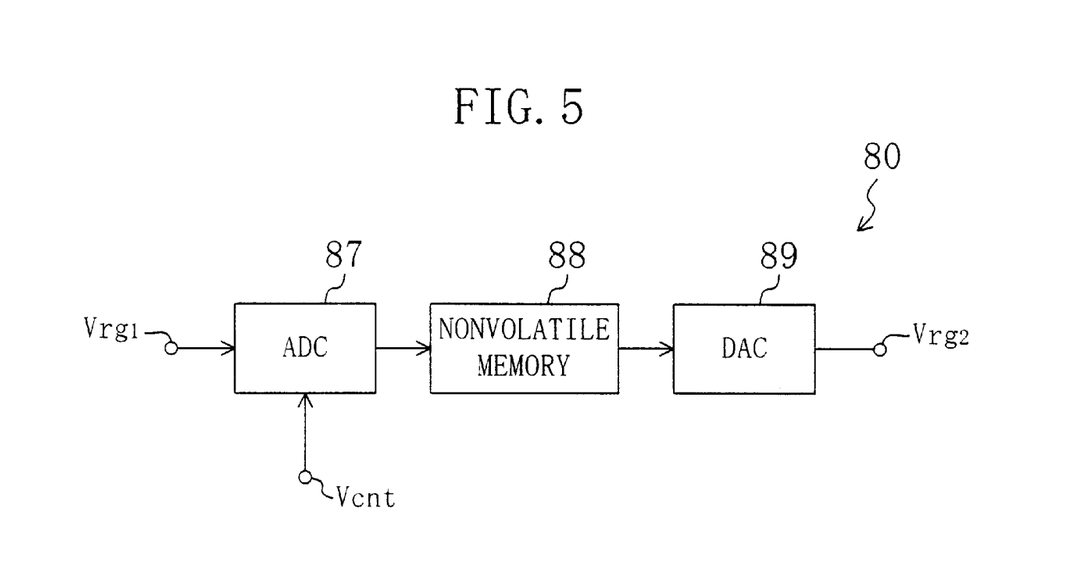
FIG. 5 is a circuit diagram illustrating another exemplary internal configuration for the voltage hold circuit shown in FIG. 1.

FIG. 5 illustrates another exemplary internal configuration for the voltage hold circuit 80 shown in FIG. 1. The voltage hold circuit 80 of FIG. 5 includes: analog-to-digital converter (ADC) 87; nonvolatile memory 88; and digital-to-analog converter (DAC) 89. The ADC 87 samples a given voltage Vrg1 in response to a voltage signal Vcnt and then converts the voltage Vrg1 into a digital value. The nonvolatile memory 88 stores the digital value obtained by the conversion thereon. Part of the memory array of the inventive flash memory may be used as the memory 88. The DAC 89 converts the digital value stored on the memory 88 to an analog voltage and then supplies the analog voltage obtained by this conversion as a gate voltage Vrg2 for the reference transistor 20. By adjusting the gate voltage Vcg2, an optimum digital value, corresponding to an optimum reference voltage Vref for reading, may be found and stored on the memory 88 in a chip testing process for the flash memory, for example. As a result, an optimum reference voltage Vref can be generated for each chip with good reproducibility.

Figure 6:
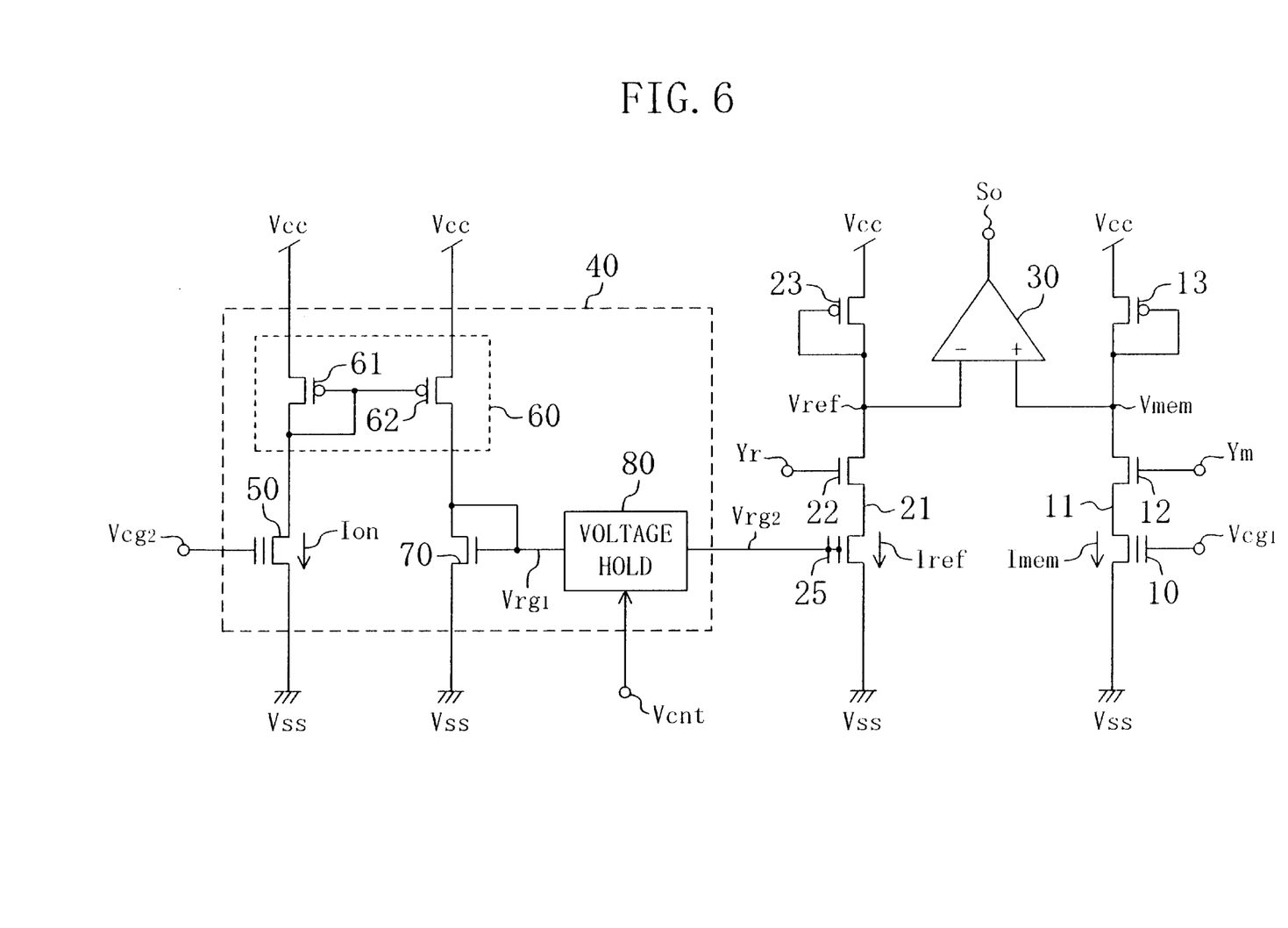
FIG. 6 is a circuit diagram illustrating another exemplary configuration for the memory device of the present invention.

FIG. 6 illustrates another exemplary configuration for the flash memory of the present invention. In FIG. 6, the single-gate reference transistor 20 shown in FIG. 1 is replaced by a reference transistor 25 that has the same structure as the MCT 10. It is noted that the reference transistor 25 includes shortcircuited control and floating gates for eliminating the RDD phenomenon. The configuration of FIG. 6 is favorable because the characteristics of the MCT and reference transistor 25 can be matched easily.

Figure 7:
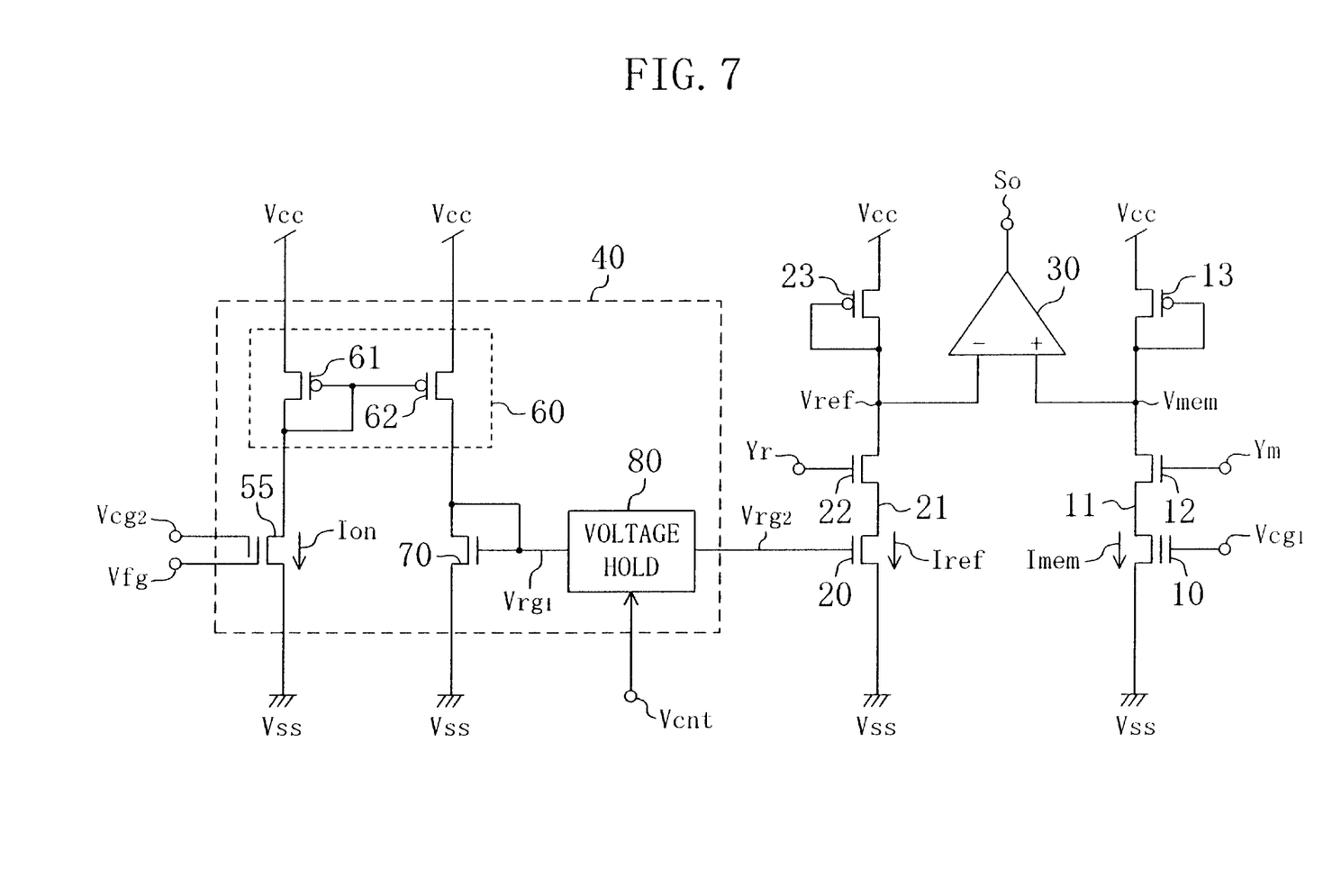
FIG. 7 is a circuit diagram illustrating still another exemplary configuration for the memory device of the present invention.

FIG. 7 illustrates still another exemplary configuration for the flash memory of the present invention. In FIG. 7, the DCT 50 shown in FIG. 1 is replaced by a DCT 55 which is provided with an electrode for receiving an arbitrary voltage Vfg at its floating gate. The floating gate of the DCT 55 shown in FIG. 7 can receive a voltage with magnitude approximately equal to the voltage at the floating gate of an MCT 10, for example, via the electrode. The voltage at the floating gate of the MCT 10 is determined by a coupling capacitance formed between the control and floating gates of the MCT 10 and another coupling capacitance formed between the floating gate of the MCT 10 and the substrate when a gate voltage Vcg1 is applied to the control gate of the MCT 10 in a read cycle (see FIGS. 2 and 3). The DCT 55 shown in FIG. 7 does not have to be supplied with a gate voltage Vcg2 at its control gate. The configuration of FIG. 7 is favorable because it can eliminate the RDD phenomenon, for instance, from the DCT 55.

Figure 8:
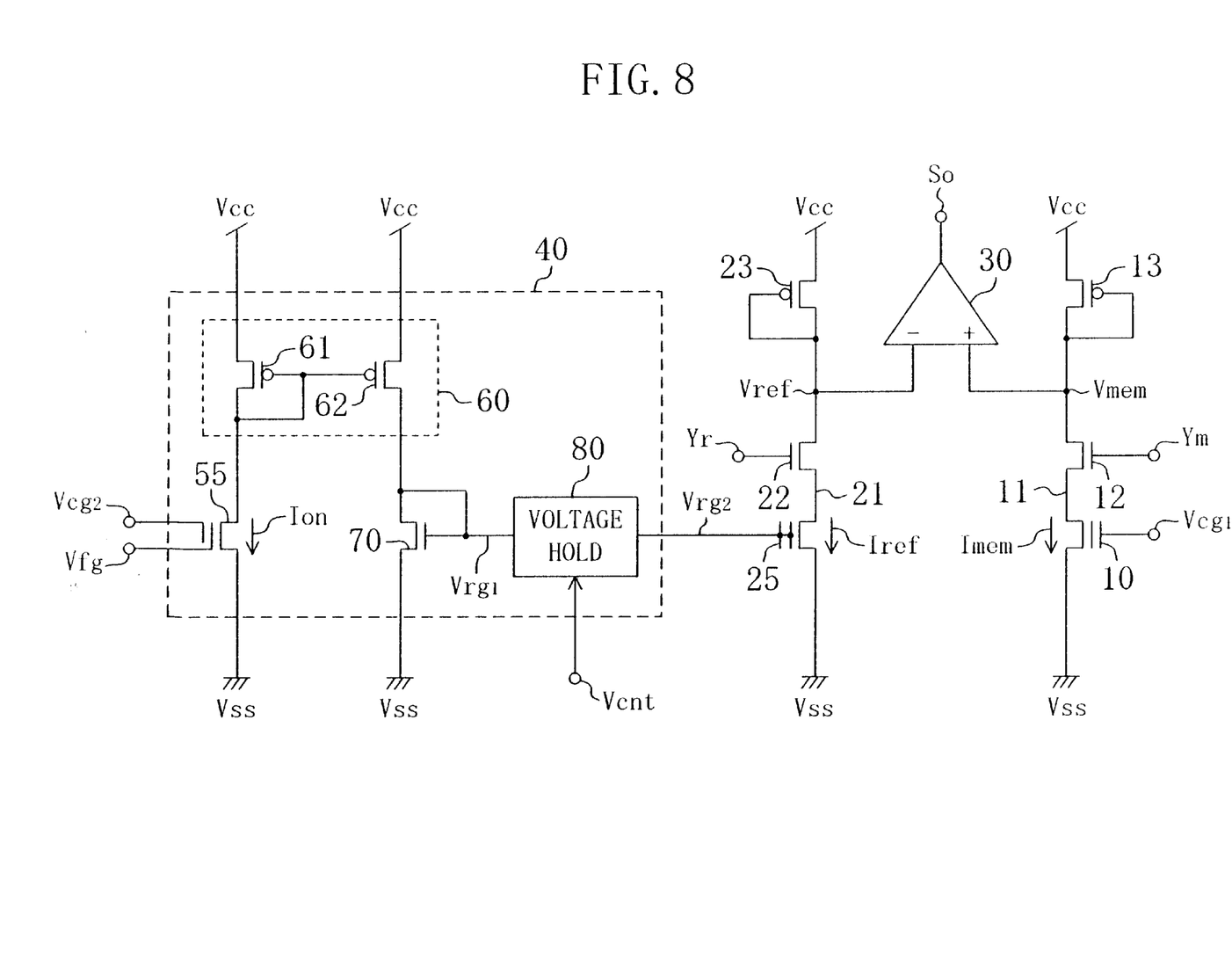
FIG. 8 is a circuit diagram illustrating yet another exemplary configuration for the memory device of the present invention.

FIG. 8 illustrates yet another exemplary configuration for the memory device of the present invention. In FIG. 8, the single-gate reference transistor 20 shown in FIG. 7 is replaced by a reference transistor 25 that has the same structure as an MCT 10. It is noted that the reference transistor 25 includes shortcircuited control and floating gates for eliminating the RDD phenomenon. The configuration of FIG. 8 is favorable because the characteristics of the MCT 10 and reference transistor 25 can be matched easily.

The voltage hold circuit 80 shown in FIG. 6, 7 or 8 may have the configuration shown in FIG. 4 or 5. The gate of the NMOS transistor 70 may be connected directly to that of the reference transistor 25 by omitting the voltage hold circuit 80 therebetween. If precharge circuits are provided for the bit and reference lines 11 and 21, the first and second load transistors 13 and 23 may also be omitted.

Each of the configurations shown in FIGS. 1, 6, 7 and 8 is applicable to the generation of reference voltages Vref for program verifying and erase verifying. The configurations shown in FIGS. 7 and 8 are particularly suitable for this specific application because the voltage Vfg at the floating gate of the DCT 55 can be controlled arbitrarily. When the voltage hold circuit 80 shown in FIG. 5 is used, the nonvolatile memory 88 may store digital values not only for reading but also for program verifying and erase verifying.

What is claimed is:

1. An electrically erasable and programmable nonvolatile semiconductor memory device comprising:
    a memory cell transistor including a control gate, a floating gate, a drain and a source and being either in OFF state, in which charge is stored on the floating gate, or in ON state, in which charge has been removed from the floating gate;
    a reference transistor with a MOS structure;
    a gate voltage generator for generating a gate voltage for the reference transistor in a read cycle;
    a bit line connected to the drain of the memory cell transistor;
    a reference line connected to the drain of the reference transistor; and
    a differential sense amplifier that compares a bit line voltage with a reference line voltage so as to sense the state of the memory cell transistor, the bit line voltage being determined by a drain current of the memory cell transistor, the reference line voltage being determined by a drain current of the reference transistor,
    wherein the gate voltage generator comprises:
        a dummy cell transistor including a control gate, a floating gate, a drain and a source as the memory cell transistor does;
        a current mirror for creating a current proportional to a drain current of the dummy cell transistor; and
        transistor means for generating a gate voltage for the reference transistor in accordance with a current created by the current mirror; and
    wherein the reference transistor comprises a control gate, a floating gate, a drain and a source as the memory cell transistor does, the control and floating gates of the reference transistor being shortcircuited with each other.

2. An electrically erasable and programmable nonvolatile semiconductor memory device comprising:
    a memory cell transistor including a control gate, a floating gate, a drain and a source and being either in OFF state, in which charge is stored on the floating gate, or in ON state, in which charge has been removed from the floating gate;
    a reference transistor with a MOS structure;
    a gate voltage generator for generating a gate voltage for the reference transistor in a read cycle;
    a bit line connected to the drain of the memory cell transistor;
    a reference line connected to the drain of the reference transistor; and
    a differential sense amplifier that compares a bit line voltage with a reference line voltage so as to sense the state of the memory cell transistor, the bit line voltage being determined by a drain current of the memory cell transistor, the reference line voltage being determined by a drain current of the reference transistor,
    wherein the gate voltage generator comprises:
        a dummy cell transistor including a control gate, a floating gate, a drain and a source as the memory cell transistor does;
        a current mirror for creating a current proportional to a drain current of the dummy cell transistor; and
        transistor means for generating a gate voltage for the reference transistor in accordance with a current created by the current mirror; and
    wherein the dummy cell transistor comprises a gate electrode for receiving an arbitrary voltage at the floating gate thereof.

3. The memory device of claim 2, wherein the floating gate of the dummy cell transistor receives a voltage with magnitude equal to a voltage at the floating gate of the memory cell transistor via the gate electrode, the voltage at the floating gate being determined by a coupling capacitance formed between the control and floating gates of the memory cell transistor and another coupling capacitance formed between the floating gate of the memory cell transistor and a substrate when a gate voltage is applied to the control gate of the memory cell transistor in the read cycle.

4. An electrically erasable and programmable nonvolatile semiconductor memory device comprising:
    a memory cell transistor including a control gate, a floating gate, a drain and a source and being either in OFF state, in which charge is stored on the floating gate, or in ON state, in which charge has been removed from the floating gate;
    a reference transistor with a MOS structure;
    a gate voltage generator for generating a gate voltage for the reference transistor in a read cycle;
    a bit line connected to the drain of the memory cell transistor;
    a reference line connected to the drain of the reference transistor; and
    a differential sense amplifier that compares a bit line voltage with a reference line voltage so as to sense the state of the memory cell transistor, the bit line voltage being determined by a drain current of the memory cell transistor, the reference line voltage being determined by a drain current of the reference transistor, wherein the gate voltage generator comprises:
- a dummy cell transistor including a control gate, a floating gate, a drain and a source as the memory cell transistor does;
- a current mirror for creating a current proportional to a drain current of the dummy cell transistor; and
- transistor means for generating a gate voltage for the reference transistor in accordance with a current created by the current mirror; and wherein the gate voltage generator further comprises means for maintaining the gate voltage generated by the transistor means.

5. The memory device of claim 4, wherein the voltage holding means comprises:

- means for converting the gate voltage, generated by the transistor means, into a digital value;
- a nonvolatile memory for storing the digital value obtained by the converting means; and
- means for converting the digital value, stored on the nonvolatile memory, into an analog voltage and supplying the analog voltage as a gate voltage for the reference transistor.

* * * * *